US012744098B2

(12) United States Patent
O'Connell

(10) Patent No.: US 12,744,098 B2
(45) Date of Patent: Sep. 22, 2026

(54) USING BUILT-IN SELF TEST OR TEST RESULTS TO IDENTIFY WEAK MEMORY BITS AND ENABLE ASSIST CIRCUITS WHEN NECESSARY

(71) Applicant: Taiwan Semiconductor Manufacturing Company Ltd., Hsinchu (TW)

(72) Inventor: Cormac Michael O'Connell, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 47 days.

(21) Appl. No.: 18/439,316

(22) Filed: Feb. 12, 2024

(65) Prior Publication Data

US 2025/0259690 A1 Aug. 14, 2025

(51) Int. Cl.
*G11C 29/12* (2006.01)

(52) U.S. Cl.
CPC .................. *G11C 29/12005* (2013.01); *G11C 2029/1204* (2013.01)

(58) Field of Classification Search
CPC .................. G11C 29/12005; G11C 2029/1204
USPC .......................................................... 714/719
See application file for complete search history.

(56) References Cited

U.S. PATENT DOCUMENTS 7,978,559 B2 * 7/2011 Kim ...................... G11C 11/417 365/210.1
11,423,977 B2 8/2022 Fujiwara et al.
2007/0236983 A1 * 10/2007 Wang .................... G11C 11/419 365/154
2010/0128541 A1 * 5/2010 Russell ................. G11C 11/419 365/230.01
2010/0208529 A1 * 8/2010 Kenkare ................ G11C 5/147 365/189.09
2010/0246298 A1 * 9/2010 Zhang .................. G11C 29/021 365/201
2010/0277990 A1 * 11/2010 Kenkare ................ G11C 29/50 365/189.011
2015/0325313 A1 * 11/2015 Badereddine .......... G11C 29/50 365/154

(Continued)

FOREIGN PATENT DOCUMENTS

TW 202147308 A 12/2021

OTHER PUBLICATIONS

Office Action issued in Taiwan Appl. No. 113119427 dated Apr. 30, 2025.

*Primary Examiner* — James C Kerveros
(74) *Attorney, Agent, or Firm* — Foley & Lardner LLP

(57) ABSTRACT

A semiconductor device and a method of operating the semiconductor device and circuit are disclosed. In one aspect, the semiconductor device includes a memory array comprising a first memory cell and a second memory cell. The second memory cell has an operational characteristic different than that of the first memory cell. The semiconductor device includes a first write circuit configured to write first data to the first memory cell. The semiconductor device includes a second write circuit configured to write second data to the second memory cell, wherein the second write circuit is selectively configured to compensate for the operational characteristic of the second memory cell.

20 Claims, 5 Drawing Sheets

(56) References Cited

U.S. PATENT DOCUMENTS

2017/0117034 A1* 4/2017 Hebig .................. G11C 11/419
2018/0294018 A1* 10/2018 Baeck .................. G11C 5/148

* cited by examiner

USING BUILT-IN SELF TEST OR TEST RESULTS TO IDENTIFY WEAK MEMORY BITS AND ENABLE ASSIST CIRCUITS WHEN NECESSARY

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
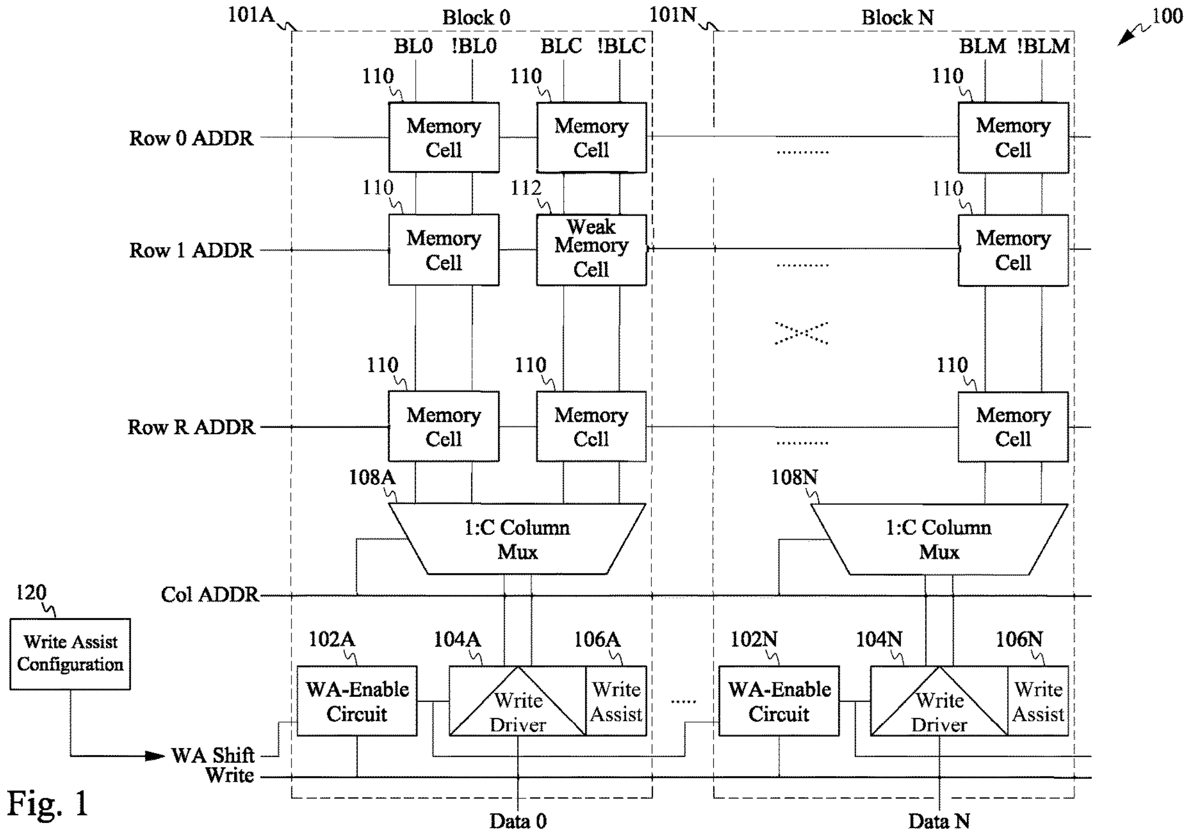
FIG. 1 illustrates a schematic block diagram of a memory array that implements selectively activated write assist circuits based on memory test results, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Design specifications provide constraints on various operational characteristics for operating memory circuits, including word line pulse width and memory write voltage, among others. As design specifications begin to utilize higher sigma values, such as six-sigma values, for smaller and denser memory circuits, these design constraints begin to affect the aggregate write performance of the memory. Even when implementing such design constraints, defects in memory cells are still possible. One such defect includes a "weak" memory cell, which are memory cells that have difficulty holding or maintaining a desired state during write operations due to various factors such as process variations, degradation over time, or other environmental conditions.

These design constraints require activating write assist circuits for the entire memory array even when only a small number of memory cells are identified as weak memory cells. Various testing approaches can be used to identify defects in manufactured memory devices, including built-in self-test (BIST) circuits or external testing circuits. However, there is a significant downside to this approach for memory device design and manufacture. The use of high sigma values means that the resulting designs are very conservative in terms of power consumption and performance, resulting in wasted active power (e.g., write word line pulse width much wider to compensate for potentially defective cells) and extended cycle time, which can be significant for some memory operations. Additionally, write assist circuits are added to every access even when they may not actually be required for non-defective memory cells, further increasing the overall power consumption of the device.

To address these and other issues, the devices, circuits, and methods described herein provide techniques for selectively activating write assist circuits only when needed to compensate for a defective memory cell. Advantages of such techniques include lower active power, reduced cycle time, higher performance memory cells, and more efficient usage of the available space on the wafer to manufacture memory chips. Selectively activating write assist circuits can be implemented in various configurations, including activating a write assist upon detecting a write operation to a specified memory block, a specified memory column, a specified memory row, or combinations thereof. Various testing approaches can be utilized to identify defective memory bits (and any block, column, or row addresses thereof), including BIST techniques or external testing techniques, among others.

These techniques can improve overall device performance and power consumption by reducing the number of write assist circuits that are activate during normal operation. Active power can be reduced by disabling certain portions of the circuits when they are not needed, thereby reducing average device power consumption. Reducing this constant activate power consumption by allowing write assist circuitry to be selectively activated enables more relaxed design constraints (e.g., 5.5$\sigma$), leading to improved timing and reduced active power.

FIG. 1 illustrates a schematic block diagram of a memory circuit 100 that implements selectively activated write assist circuits 106A-106N based on memory test results, in accordance with some embodiments. As shown, the memory circuit 100 includes an array of memory cells 110 (sometimes referred to herein as "bit cells,") which may store digital data. Each of the components shown in the memory circuit 100 may receive power from one or more voltage sources. The memory circuit 100 may include one or more logic gates and sub-circuits, each of which may be constructed from one or more logic gates. Logic gates are electronic devices that perform logical operations on one or more input signals to produce a single output signal.

Various embodiments of the circuits and logic gates that implement the memory circuit 100 may include various transistors. The transistors described herein may have a certain type (n-type or p-type), but embodiments are not limited thereto. The transistors can be any suitable type of transistor including, but not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like.

As shown, the memory circuit 100 includes a number of memory blocks 101A-101N (sometimes generally referred to as memory block(s) 101), each of which include various memory cells 110. The memory cell 110 can be any type of memory device capable of storing at least one bit of memory data, including but not limited to a static random access memory (SRAM) cell or a dynamic random access memory (DRAM) cell, among others. The memory cell 110 may, due to the nature of the manufacturing process used to create the memory cell, be manufactured with one or more defects. Such defects may cause the memory cell to be a "weak memory" cell, which have difficulty holding or maintaining a desired (e.g., written) state during write operations due to various factors such as process variations, degradation over time, or other environmental conditions. Memory cells 110 that have such defects may be referred to herein as a weak memory cell 112.

As shown, each memory block 101 can include one or more columns of memory cells 110, which are arranged in corresponding rows. Each column of a memory block 101 may include one or more weak memory cells 112. In this example, each memory block 101 is shown as including two columns of memory cells 110 (or weak memory cells 112). However, it should be understood that each block may include any number of columns, designated in this example by the identifier C (e.g., the total number of columns in the block). Each column in the memory block 101 can be addressed by a corresponding set of bit lines, such as the bit line BLO and its corresponding logical inverse bit line. If multiple columns are included in the memory block 101, the memory block 101 can include a corresponding multiplexer circuit.

In this example, the memory block 101A includes two memory columns, and therefore includes a 1:2 multiplexer circuit 108A (sometimes generally referred to as a multiplexer circuit 108), which switches between the bit lines BLO and the bit lines BLC based on an input column address (shown as Col ADDR) signal received from a memory control circuit. In this example, each memory block 101 includes two columns of memory cells 110, and therefore the multiplexer circuits 108 (e.g., the multiplexer circuits 108A-108N) are each 1:2 multiplexer circuits. The multiplexer circuits 108 receive corresponding bit line signals from a write driver circuit 104 of the corresponding memory block 101 (e.g., one of the write driver circuits 104A-104N) and provide respective output bit line signals to the selected column. The multiplexer circuit 108 can select between each column based on a column address (shown here as Col ADDR), which may be received from a memory control circuit.

As shown, the memory cells 110 (and weak memory cells 112) are arranged in one or more rows, each of which may be selected using a corresponding row address (shown here as a Row ADDR, spanning from 0 to R rows as the Row 0 ADDR to the Row R ADDR). Each row address can be provided by a memory control circuit for the memory blocks 101 of the memory, which can select a corresponding row and column of the column address and row address signals. The memory control circuit may include any type of control circuit that provides signals to coordinate read or write operations via the circuitry of the memory circuit 100. For example, the memory control circuit may provide a write enable signal (shown here as "Write"), which activates various components of the write enable driver. For example, the write enable signal may activate a corresponding write driver circuit 104, write assist circuit 106, and/or write assist enable circuit 102, of the memory block 101.

As shown, each memory block 101 is shown as including one of the write driver circuits 104A-104N (sometimes generally referred to as a write driver circuit 104). Each write driver circuit 104 can generate one or more signals to writing input data (shown here as "Data 0" for the first memory block 101A, and "Data N" for the N-th memory block 101N) to selected memory cells 110. To do so, a write driver circuit 104 can drive the bit lines corresponding to the selected memory cell 110 (e.g., the bit lines BLC and !BLC, where the ! designator indicates the logical inverse of the corresponding signal) for a write operation to store the input data (e.g., Data 0) within an addressed memory cell 110 (or weak memory cell 112). In some implementations, the write driver 104 includes a level shifter circuit, which can adjust voltage levels of the output signals to align them with voltage requirements of the memory cell 110 to be written. The write driver circuit 104 can include write enable logic, which causes the write driver circuit 104 to remain deactivated until a write enable signal is received (shown here as the "Write" signal).

As shown, the write driver circuits 104A-104N are integrated with corresponding write assist circuits 106A-106N (sometimes generally referred to as "write assist circuit(s) 106"). A write assist circuit 106 can be used to compensate for the defective weak memory cells 112, which may include different operational characteristics than the memory cells 110. For example, the weak memory cells 112 may require a higher voltage across its corresponding storage element to effectively write data to the weak memory cell 112, as compared to the memory cells 110. Each write assist circuit 106 may therefore selectively increase the voltage provided by its corresponding write driver circuit 104, when the write assist circuit 106 is activated. The write assist circuit 106 may apply negative voltage write assist and positive voltage write assist to increase the voltage difference across the weak memory cell 112, when selected for a write operation.

A negative voltage write assist operation involves applying a temporary negative voltage to at least one of the bit lines during the write operation (e.g., reducing what would otherwise be a ground voltage), thereby effectively increasing the total voltage potential across the weak memory cell 112 to compensate for its operational characteristics. A positive voltage write assist operation includes boosting the positive voltage to at least one bit line during the write operation, thereby increasing the voltage potential across the weak memory cell 112. To implement these operations, the write assist circuit 106 may include one or more boost circuits, charge pump circuits, or other circuits to raise or lower the voltage of one or more bit lines (e.g., the bit line BLC, the bit line !BLC, etc.).

Each of the memory blocks 101A-101N is shown as including corresponding write assist enable circuits 102A-102N (sometimes generally referred to as write assist enable circuit(s) 102). The write assist enable circuit 102 can include logic (e.g., transistors, logic gates, latches, flip-flops, registers, etc.) that cause the write assist circuits 106 to be selectively activated or deactivated according to an input signal from the write assist configuration circuit 120. For example, the write assist enable circuit 102 can produce a signal that selectively activates the write assist circuit 106 for a corresponding memory block 101 when the write assist enable circuit 102 receives a programming signal from the write assist configuration circuit 120 that indicates the memory block 101 includes a defective memory cell (shown here as the weak memory cell 112 in the second column).

In some implementations, the write assist enable circuit 102 may be part of a shift register (e.g., a chain of flip flops). For example, the write assist enable circuit 102 of each memory block may provide an output to the next write assist enable circuit 102 of the following memory block 101 in the memory array. Configuration data can be iteratively shifted through each of the write assist enable circuits 102 in the memory circuit 100 to configure the circuit. The configuration data can indicate which write assist enable circuits 102 are to enable corresponding write assist circuits 106 of the memory circuit 100 during a write operation, and which write assist circuits 106 are to remain deactivated during the write operation. In this example, the write assist enable circuit 102A can be configured via configuration data to activate the write assist circuit 106A because the memory block 101A includes the weak memory cell 112, while the write assist enable circuit 102N may receive to deactivate the write assist circuit 106N because the memory block 101N is shown as not including any defective memory cells.

The configuration data for the write assist enable circuits 102 can be stored in the write assist configuration circuit 120, which may include any suitable programmable storage device for configuring the memory circuit 100. In some implementations, the configuration data stored in the write assist configuration circuit 120 may be provided to (e.g., shifted through) each of the write assist enable circuits 102 after reset, power-on, or another predetermined event. For example, upon receiving a resent signal, the write assist enable circuits 102 of the memory circuit 100 can iteratively shift through configuration data until all of the write assist enable circuits 102 are configured.

The write assist configuration circuit 120 may include any type of storage device that is suitable for storing the configuration data for each of the write assist enable circuits 102. In this example, the configuration data indicates whether the write assist circuit 106 for a particular memory block 101 is to be activated in the event of a write operation to a memory cell 110 included in that memory block 101. Additional implementations of the configuration data that may be stored in the write assist configuration circuit 120 are described in connection with FIGS. 2, 3, and 4. The write assist configuration circuit 120 may include any suitable type of programmable memory, including eFuse memory, flash memory, or the like. The write assist configuration circuit 120 may include logic to configure each of the write assist enable circuits 102, for example, by iteratively shifting data through each of the write assist enable circuits 102 until all write assist enable circuits 102 are configured.

The write assist configuration circuit 120 may include or may be in communication with one or more testing circuits, such as a BIST circuit or a built-in self-test and repair (BISTR) circuit that operates to test the operational characteristics of the memory circuit 100. In some implementations, the write assist configuration circuit 120 may be in communication with an external testing circuit that performs similar operations as a BIST or BISTR circuit. Results from such testing circuits may be stored in the programmable memory of the write assist configuration circuit 120 as the configuration data for the write assist enable circuits 102. The testing circuits can include test pattern generators, response analyzers, and control logic that enables the testing circuits to execute a series of the memory array to identify any memory cells that are defective (e.g., the weak memory cell 112).

The testing process may be performed as part of the manufacturing process to identify the weak memory cells 112. Corresponding configuration data can then be generated that identifies which memory cells are defective or have normal operating characteristics. In some implementations, and as described in further detail in connection with FIGS. 2, 3, and 4, the configuration data may include row addresses and/or column addresses of identified weak memory cells 112 in the memory circuit 100. In some implementations, an indication of whether each memory block 101 includes at least one weak memory cell 112 is provided. In the example shown in FIG. 1, such indications may be provided to configure each write assist enable circuit 102 to selectively enable the write assist circuits 106 to write to any identified weak memory cells 112.

In some implementations, the write assist configuration circuit 120 may dynamically update the configuration data stored in its programmable memory. For example, the write assist configuration circuit 120 may utilize BIST or BISTR circuits to periodically test the memory cells 110 of the memory circuit 100 to determine whether any memory cells 110 have become weak memory cells 112. Upon identifying any additional weak memory cells 112, the write assist configuration circuit 120 can update the configuration data with identifier(s) of a memory block 101, column address, and/or row address of the weak memory cell 112, which can be used to configure the write assist enable circuits 102 as described herein. The write assist configuration circuit 120 provides the configuration signal to the write assist enable circuits 102 as the "WA shift" signal, which can be propagated through each of the write assist enable circuits 102 via at least one shift register included in the write assist enable circuits 102. Each storage flip-flop in the shift register can be included in a respective write assist enable circuit 102 and can include an indication identifying whether the corresponding memory block 101 includes at least one weak memory cell 112. Additional implementations for selectively activating write assist circuits are described in connection with FIGS. 2, 3, and 4.

Figure 2:
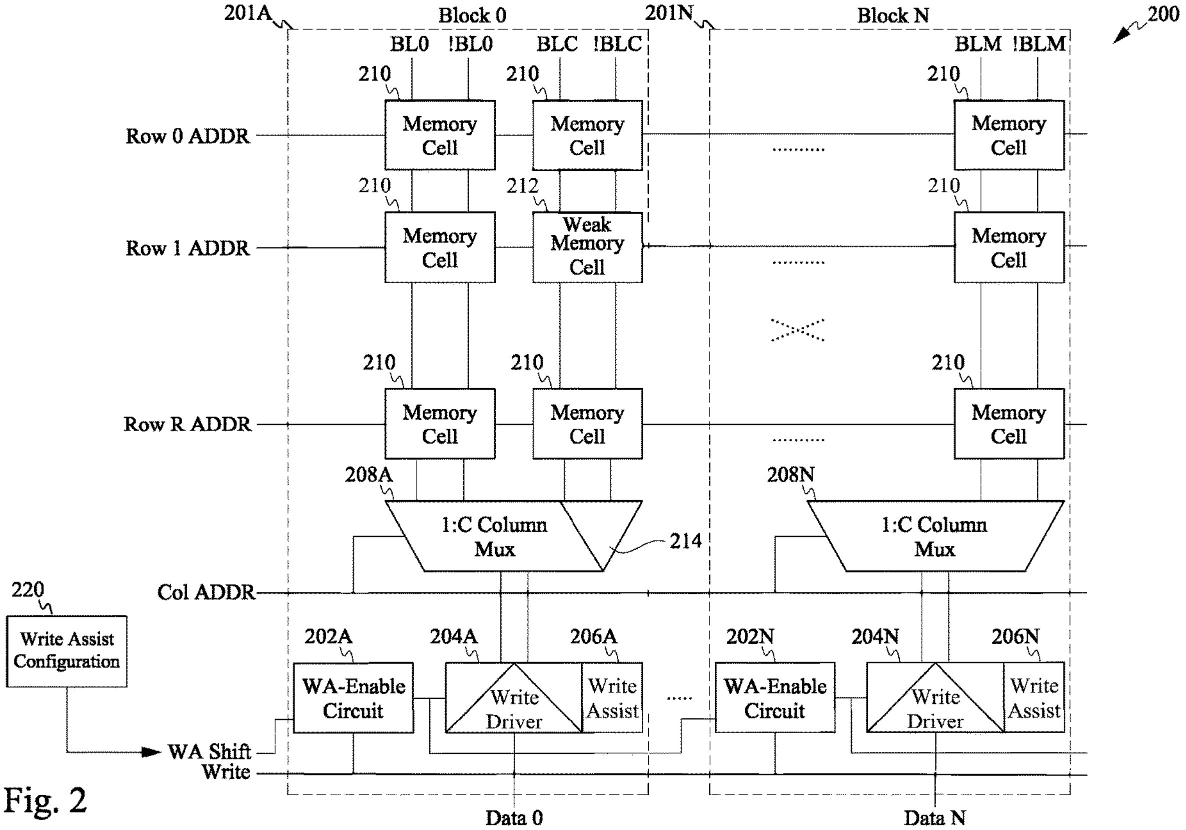
FIG. 2 illustrates a schematic block diagram of another memory array that implements selectively activated write assist circuits according to a specified column address, in accordance with some embodiments.

Referring to FIG. 2, illustrated is a schematic block diagram of memory circuit 200 that implements selectively activated write assist circuits (e.g., the write assist circuits 206A-206N, sometimes generally referred to as the write assist circuit(s) 206) according to a specified column address, in accordance with some embodiments. As shown, the memory circuit 200 includes an array of memory cells 210 which may store digital data and may include any of the structure and functionality of the memory cells 110 of FIG. 1. Each of the components shown in the memory circuit 200 may receive power from one or more voltage sources. The memory circuit 200 may include one or more logic gates and sub-circuits, each of which may be constructed from one or more logic gates. Logic gates are electronic devices that perform logical operations on one or more input signals to produce a single output signal.

Various embodiments of the circuits and logic gates that implement the memory circuit 200 may include various transistors. The transistors described herein may have a certain type (n-type or p-type), but embodiments are not limited thereto. The transistors can be any suitable type of transistor including, but not limited to, MOSFET, CMOS transistors, PMOS, NMOS, BJT, high voltage transistors, high frequency transistors, PFETs/NFETs, FinFETs, planar MOS transistors with raised source/drains, nanosheet FETs, nanowire FETs, or the like.

As shown, the memory circuit 200 includes memory blocks 201A-201N (sometimes generally referred to as memory block(s) 201), each of which include memory cells 210. Each of the memory blocks 201 and memory cells 210 may be similar to, and include any of the structure and functionality of, the memory blocks 101 and memory cells 110 described in connection with FIG. 1, respectively. As described herein, a memory cell 210 may, due to the nature of the manufacturing process used to create the memory cell, be manufactured with one or more defects. Such defects may cause the memory cell to be a "weak memory cell," which have difficulty holding or maintaining a desired (e.g., written) state during write operations due to various factors such as process variations, degradation over time, or other environmental conditions. Memory cells 210 that have such defects may be referred to herein as a weak memory cell 212.

As described herein, if multiple columns of memory cells 210 (or weak memory cells 212) are included in a memory block 201, the memory block 201 can include a corresponding multiplexer circuit. In this example, the memory blocks 201A-201N each include two memory columns, and the memory blocks 201A-201N include 1:2 multiplexer circuits 208A-208N (sometimes generally referred to as multiplexer circuit(s) 208). The multiplexor circuits 208 may be similar to, and include any of the structure and functionality of, the multiplexor circuits 108 of FIG. 1. The multiplexer circuit 208 can select between each column in a memory block 201 based on a column address (shown here as Col ADDR), which may be received from a memory control circuit.

As shown, the memory cells 210 (and weak memory cells 212) are arranged in one or more rows, each of which may be selected using a corresponding row address (shown here as a Row ADDR, spanning from 0 to R rows as the Row 0 ADDR to the Row R ADDR). Each row address can be provided by a memory control circuit for the memory blocks 201 of the memory, which can select a corresponding row and column of the column address and row address signals. The memory control circuit may include any type of control circuit that provides signals to coordinate read or write operations via the circuitry of the memory circuit 200. For example, the memory control circuit may provide a write enable signal (shown here as "Write"), which activates various components of the write enable driver. For example, the write enable signal may activate a corresponding write driver circuit 204, write assist circuit 206, and/or write assist enable circuit 202, of the memory block 201.

Each memory block 201 is shown as including one of the write driver circuits 204A-204N (sometimes generally referred to as the write driver circuit(s) 204). The write driver circuits 204 may be similar to, and include any of the structure and functionality of, the write driver circuits 104 of FIG. 1. For example, as described herein, the write driver circuits 204 can drive the bit lines corresponding to an addressed memory cell 210 (e.g., the bit lines BLC and !BLC) for a write operation to store the input data (e.g., Data 0) within the addressed memory cell 210 (or weak memory cell 212). As shown, the write driver circuits 204A-204N are integrated with corresponding write assist circuits 206A-206N (sometimes generally referred to as "write assist circuit(s) 206"), which may include any of the structure or functionality of the write assist circuits 106 of FIG. 1. For example, the write assist circuits 206 may perform negative voltage write assist or positive voltage write assist operations to increase the voltage across a selected weak memory cell 212.

Each of the memory blocks 201A-201N is shown as including corresponding write assist enable circuits 202A-202N (sometimes generally referred to as write assist enable circuit(s) 202). The write assist enable circuit 202 can include logic (e.g., transistors, logic gates, latches, flip-flops, registers, etc.) that cause the write assist circuits 206 to be selectively activated or deactivated according to an input signal from the write assist configuration circuit 220.

In the example shown in FIG. 2, the write assist enable circuits 202 can perform a match operation between one or more stored column addresses and an input column address for a write operation (e.g., a Col ADDR). The stored column addresses to which the input column address is compared may be columns of the corresponding memory block 201 that have been determined to include at least one defective memory cell 212. The comparison may be performed via one or more logic gates or comparison circuits of the corresponding write assist enable circuit 202. Upon detecting a match between the input column address and the column address for a column that includes a weak memory cell 212, the write assist enable circuit 202 can selectively activate the write assist circuit 206 to compensate for the operational characteristics of the weak memory cell 212. In this example, the right-hand column of the memory block 201A includes a weak memory cell 212.

When a write operation addresses the right-most column of the memory block 201A to perform a write operation, the write assist enable circuit 206A detects a match between the input column address and the address of the right-most column and produces a signal to activate the write assist circuit 206A. The write assist circuit 206A can then produce an increased voltage potential across the bit lines BLC and !BLC (e.g., relative to a normal write operation). This increased voltage potential is provided via the second output 214 of the multiplexer circuit 208A. The increased voltage enables a successful write operation at the weak memory cell 212. In this example, the write assist enable circuit 202 selectively activates the write assist circuit 206 only when a corresponding column of the memory block 201 that includes a weak memory cell is being written to. The write assist circuit 206 is disabled, and normal voltage is applied, when a column of the same memory block 201 that does not include a weak memory cell 212 is written to.

As described herein, the configuration data for the write assist enable circuits 202 can be stored in the write assist configuration circuit 220, which may be similar to and include any of the structure and functionality of the write assist configuration circuit 120 of FIG. 1. In this example, the configuration data that is provided to (e.g., shifted through) one or more registers of the write assist enable circuits 202A-202N can include column addresses of each of any columns in the memory blocks 201A-201N that are determined (e.g., via the testing processes described herein) to include at least one weak memory cell 212. The configuration data may be provided to the write assist enable circuits 202 in response to a reset, power-on, or a configuration signal. Additional implementations for selectively activating write assist circuits based on row addresses (e.g., the row addresses Row 0 ADDR through Row R ADDR) are described in connection with FIGS. 3 and 4.

Figure 3:
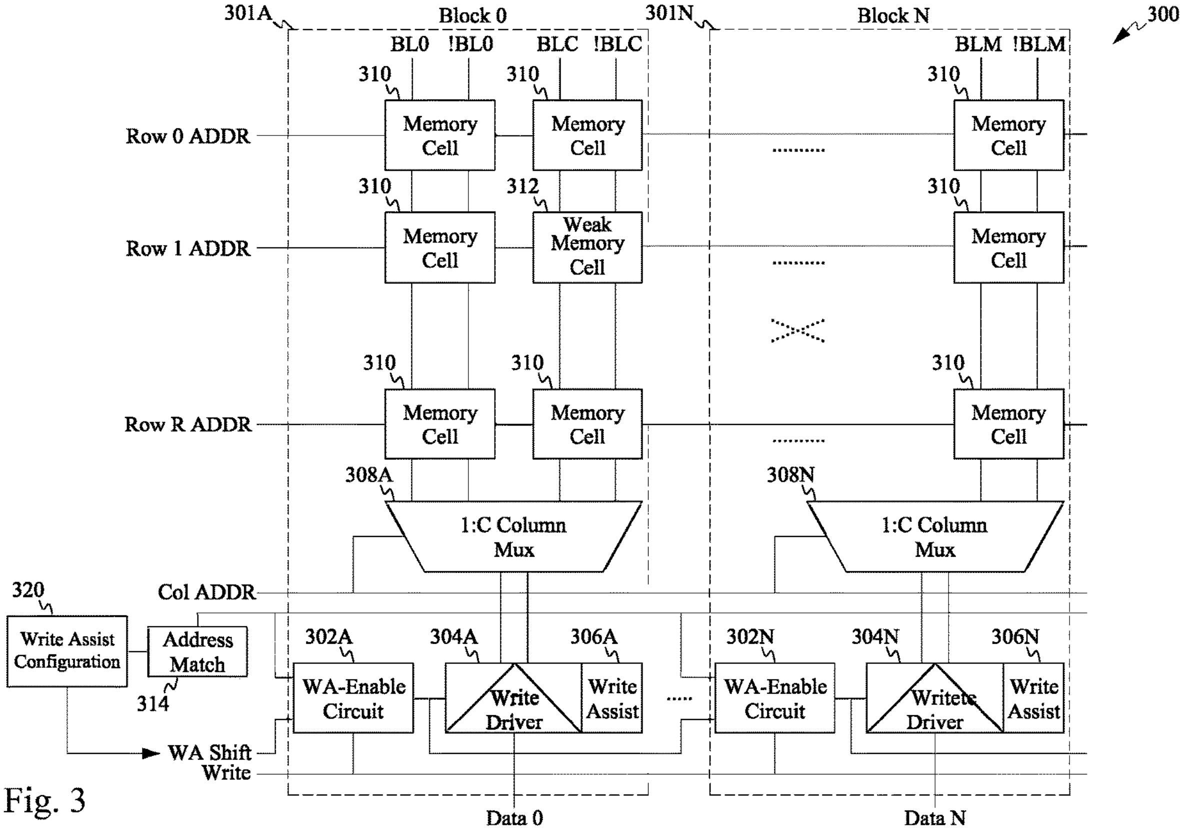
FIG. 3 illustrates a schematic block diagram of another memory array that implements selectively activated write assist circuits according to a specified row address, in accordance with some embodiments.

Referring to FIG. 3, illustrated is a schematic block diagram of a memory circuit 300 that implements selectively activated write assist circuits (e.g., the write assist circuits 306A-306N) according to specified row addresses (e.g., the row addresses Row 0 ADDR through Row R ADDR), in accordance with some embodiments. The memory circuit 300 may be similar to, and include any of the structure and functionality of, the memory circuit 200 of FIG. 2 or the memory circuit 100 of FIG. 1. As shown, the memory circuit 300 includes an array of memory cells 310 which may store digital data, and may include any of the structure and functionality of the memory cells 110 of FIG. 1. Each of the components shown in the memory circuit 300 may receive power from one or more voltage sources. The memory circuit 300 may include one or more logic gates and sub-circuits, each of which may be constructed from one or more logic gates. Logic gates are electronic devices that perform logical operations on one or more input signals to produce a single output signal.

Various embodiments of the circuits and logic gates that implement the memory circuit 300 may include various transistors. The transistors described herein may have a certain type (n-type or p-type), but embodiments are not limited thereto. The transistors can be any suitable type of transistor including, but not limited to, MOSFET, CMOS transistors, PMOS, NMOS, BJT, high voltage transistors, high frequency transistors, PFETs/NFETs, FinFETs, planar MOS transistors with raised source/drains, nanosheet FETs, nanowire FETs, or the like.

As shown, the memory circuit 300 includes memory blocks 301A-301N (sometimes generally referred to as memory block(s) 301), each of which include memory cells 310. Each of the memory blocks 301 and memory cells 310 may be similar to, and include any of the structure and functionality of, the memory blocks 101 and memory cells 110 described in connection with FIG. 1, respectively. As described herein, a memory cell 310 may, due to the nature of the manufacturing process used to create the memory cell, be manufactured with one or more defects. Such defects may cause the memory cell to be a "weak memory cell," which have difficulty holding or maintaining a desired (e.g., written) state during write operations due to various factors such as process variations, degradation over time, or other environmental conditions. Memory cells 310 that have such defects may be referred to herein as a weak memory cell 312.

As described herein, if multiple columns of memory cells 310 (or weak memory cells 312) are included in a memory block 301, the memory block 301 can include a corresponding multiplexer circuit. In this example, the memory blocks 301A-301N each include two memory columns, and the memory blocks 301A-301N include 1:2 multiplexer circuits 308A-308N (sometimes generally referred to as multiplexer circuit(s) 308). The multiplexor circuits 308 may be similar to, and include any of the structure and functionality of, the multiplexor circuits 108 of FIG. 1. The multiplexer circuit 308 can select between each column in a memory block 301 based on a column address (shown here as Col ADDR), which may be received from a memory control circuit.

As shown, the memory cells 310 (and weak memory cells 312) are arranged in one or more rows, each of which may be selected using a corresponding row address (shown here as a Row ADDR, spanning from 0 to R rows as the Row 0 ADDR to the Row R ADDR). Each row address can be provided by a memory control circuit for the memory blocks 301 of the memory, which can select a corresponding row and column of the column address and row address signals. The memory control circuit may include any type of control circuit that provides signals to coordinate read or write operations via the circuitry of the memory circuit 300. For example, the memory control circuit may provide a write enable signal (shown here as "Write"), which activates various components of the write enable driver. For example, the write enable signal may activate a corresponding write driver circuit 304, write assist circuit 306, and/or write assist enable circuit 302, of the memory block 301.

Each memory block 301 is shown as including one of the write driver circuits 304A-304N (sometimes generally referred to as the write driver circuit(s) 304). The write driver circuits 304 may be similar to, and include any of the structure and functionality of, the write driver circuits 104 of FIG. 1. For example, as described herein, the write driver circuits 304 can drive the bit lines corresponding to an addressed memory cell 310 (e.g., the bit lines BLC and !BLC) for a write operation to store the input data (e.g., Data 0) within the addressed memory cell 310 (or weak memory cell 312). As shown, the write driver circuits 304A-304N are integrated with corresponding write assist circuits 306A-306N (sometimes generally referred to as "write assist circuit(s) 306"), which may include any of the structure or functionality of the write assist circuits 106 of FIG. 1. For example, the write assist circuits 306 may perform negative voltage write assist or positive voltage write assist operations to increase the voltage across a selected weak memory cell 312.

Each of the memory blocks 301A-301N is shown as including corresponding write assist enable circuits 302A-302N (sometimes generally referred to as write assist enable circuit(s) 302). The write assist enable circuits 302 can include any of the structure or functionality the write assist enable circuits 102 of FIG. 1. The write assist enable circuit 302 can include logic (e.g., transistors, logic gates, latches, flip-flops, registers, etc.) that cause the write assist circuits 306 to be selectively activated or deactivated according to an input signal from the write assist configuration circuit 320.

In the example shown in FIG. 3, the write assist enable circuits 302 can enable corresponding write assist circuits 306 in response to a signal from the address match circuit 314. For example, as described in connection with FIG. 1, each write assist enable circuit 302 may include a register or other storage device that stores an indication of whether the memory block 301 corresponding thereto includes at least one weak memory cell 312. As described herein, the write assist configuration circuit 320 (which may be similar to and include any of the structure and functionality of the write assist configuration circuit 120 of FIG. 1) provides configuration data to the write assist enable circuits 302 as the "WA shift" signal, which can be propagated through each of the write assist enable circuits 302 via at least one shift register included in the write assist enable circuits 302. Each storage flip-flop in the shift register can be included in a respective write assist enable circuit 302 and can include an indication identifying whether the corresponding memory block 301 includes at least one weak memory cell 312.

Additionally, the write assist configuration circuit 320 can provide data to a row address match circuit 314. The row address match circuit 314 can provide an activation signal to the write assist enable circuits 302 in response to detecting a match between an input row address of the memory circuit 300 and a stored row address that is identified as including a weak memory cell 312. For example, in addition to providing an indication of whether each memory block 301 includes at least one weak memory cell 312, the write assist configuration circuit 320 can additionally provide addresses of rows within which weak memory cells 312 have been detected. The row addresses can be determined, in some implementations, based on the testing techniques described herein. The write assist configuration circuit 320 can provide the detected row addresses to the row address match circuit 314, for example, in response to a reset, a power-on, or in response to a configuration signal. The write assist configuration circuit 320 can therefore provide configuration data to both the address match circuit and the write assist enable circuit 302.

The row address match circuit 314 can include logic gates, transistors, or any other device or circuit that can compare an input row address for a write operation and a stored row address provided by the write assist configuration circuit 320. In some implementations, the row address match circuit 314 can include one or more storage devices, registers, or memory devices that store the row addresses provided by the write assist configuration circuit 320. The comparison performed by the row address match circuit 314 can produce a signal that indicates whether the input row address matches a stored (or provided) row address of a row (e.g., the Row 1 ADDR in this example) that includes a weak memory cell 312.

If the row address match circuit 314 detects a match, the row address match circuit 314 can provide an activation signal to the write assist enable circuits 302. If, during the write operation, the write assist enable circuit 302 also has received an indication (e.g., via the WA Shift signal) that its corresponding memory block 301 includes at least one weak memory cell 312, the write assist enable circuit 302 can activate the write assist circuit 306 integrated with the corresponding write driver circuit 304, to compensate for the operational characteristics of the weak memory cell 312. In this example, if a write operation occurs to write to Row 1 (e.g., as designated by the write address) and to the memory block 301A, the write enable assist circuit 302A can provide a signal to activate the write assist circuit 306A integrated with the write driver circuit 304A, as shown. This approach selectively activates the write assist circuit 306 only when a row and a memory block 301 to which a write operation is to be performed includes at least one weak memory cell 312. For example, as the memory block 301N is not shown as including any weak memory cells, the write assist enable circuit 302 will not activate the write assist circuit 306, thereby conserving power when write operations are performed to the memory block 301N. An additional implementation in which both the row address and column address are used to selectively activate the write assist circuits is described in connection with FIG. 4.

Figure 4:
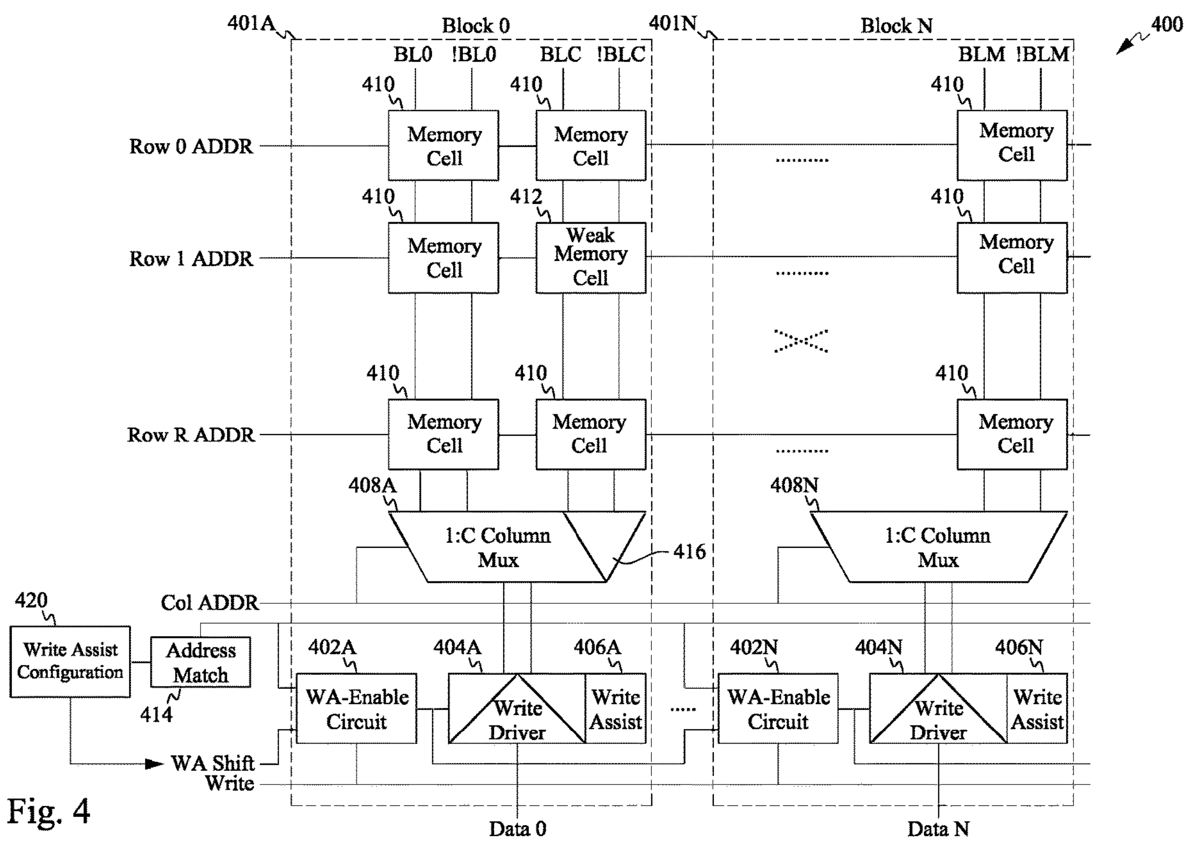
FIG. 4 illustrates a schematic block diagram of another memory array that implements selectively activated write assist circuits according to a specified row address and a specified column address, in accordance with some embodiments.

Referring to FIG. 4, illustrated is a schematic block diagram of a memory circuit 400 that implements selectively activated write assist circuits 406A-406N (sometimes generally referred to as the write assist circuit(s) 406) according to a specified row address (e.g., one of the row addresses Row 0 ADDR through Row R ADDR) and a specified column address (e.g., the Col ADDR), in accordance with some embodiments. The memory circuit 400 may be similar to, and include any of the structure and functionality of, the memory circuit 300 of FIG. 3, the memory circuit 200 of FIG. 2, or the memory circuit 100 of FIG. 1. As shown, the memory circuit 400 includes an array of memory cells 410 which may store digital data, and may include any of the structure and functionality of the memory cells 110 of FIG. 1. Each of the components shown in the memory circuit 400 may receive power from one or more voltage sources. The memory circuit 400 may include one or more logic gates and sub-circuits, each of which may be constructed from one or more logic gates. Logic gates are electronic devices that perform logical operations on one or more input signals to produce a single output signal.

Various embodiments of the circuits and logic gates that implement the memory circuit 400 may include various transistors. The transistors described herein may have a certain type (n-type or p-type), but embodiments are not limited thereto. The transistors can be any suitable type of transistor including, but not limited to, MOSFET, CMOS transistors, PMOS, NMOS, BJT, high voltage transistors, high frequency transistors, PFETs/NFETs, FinFETs, planar MOS transistors with raised source/drains, nanosheet FETs, nanowire FETs, or the like.

As shown, the memory circuit 400 includes memory blocks 401A-401N (sometimes generally referred to as memory block(s) 401), each of which include memory cells 410. Each of the memory blocks 401 and memory cells 410 may be similar to, and include any of the structure and functionality of, the memory blocks 101 and memory cells 110 described in connection with FIG. 1, respectively. As described herein, a memory cell 410 may, due to the nature of the manufacturing process used to create the memory cell, be manufactured with one or more defects. Such defects may cause the memory cell to be a "weak memory cell," which have difficulty holding or maintaining a desired (e.g., written) state during write operations due to various factors such as process variations, degradation over time, or other environmental conditions. Memory cells 410 that have such defects may be referred to herein as a weak memory cell 412.

As described herein, if multiple columns of memory cells 410 (or weak memory cells 412) are included in a memory block 401, the memory block 401 can include a corresponding multiplexer circuit. In this example, the memory blocks 401A-401N each include two memory columns, and the memory blocks 401A-401N include 1:2 multiplexer circuits 408A-408N (sometimes generally referred to as multiplexer circuit(s) 408). The multiplexor circuits 408 may be similar to, and include any of the structure and functionality of, the multiplexor circuits 108 of FIG. 1. The multiplexer circuit 408 can select between each column in a memory block 401 based on a column address (shown here as Col ADDR), which may be received from a memory control circuit.

As shown, the memory cells 410 (and weak memory cells 412) are arranged in one or more rows, each of which may be selected using a corresponding row address (shown here as a Row ADDR, spanning from 0 to R rows as the Row 0 ADDR to the Row R ADDR). Each row address can be provided by a memory control circuit for the memory blocks 401 of the memory, which can select a corresponding row and column of the column address and row address signals. The memory control circuit may include any type of control circuit that provides signals to coordinate read or write operations via the circuitry of the memory circuit 400. For example, the memory control circuit may provide a write enable signal (shown here as "Write"), which activates various components of the write enable driver 404. For example, the write enable signal may activate a corresponding write driver circuit 404, write assist circuit 406, and/or write assist enable circuit 402, of the memory block 401.

As described in connection with FIGS. 1-3, each memory block 401 is shown as including one of the write driver circuits 404A-404N (sometimes generally referred to as the write driver circuit(s) 404). The write driver circuits 404 may be similar to, and include any of the structure and functionality of, the write driver circuits 104 of FIG. 1. For example, as described herein, the write driver circuits 404 can drive the bit lines corresponding to an addressed memory cell 410 (e.g., the bit lines BLC and !BLC) for a write operation to store the input data (e.g., Data 0) within the addressed memory cell 410 (or weak memory cell 412). As shown, the write driver circuits 404A-404N are integrated with corresponding write assist circuits 406A-406N (sometimes generally referred to as "write assist circuit(s) 406"), which may include any of the structure or functionality of the write assist circuits 106 of FIG. 1. For example, the write assist circuits 406 may perform negative voltage write assist or positive voltage write assist operations to increase the voltage across a selected weak memory cell 412, as described herein.

Each of the memory blocks 401A-401N is shown as including corresponding write assist enable circuits 402A-402N (sometimes generally referred to as write assist enable circuit(s) 402). The write assist enable circuits 402 can include any of the structure or functionality of the write assist enable circuits 102 of FIG. 1. The write assist enable circuit 402 can include logic (e.g., transistors, logic gates, latches, flip-flops, registers, etc.) that cause the write assist circuits 406 to be selectively activated or deactivated according to an input signal from the write assist configuration circuit 420.

In the example shown in FIG. 4, the write assist enable circuits 402 can enable corresponding write assist circuits 406 in response to a signal from the address match circuit 414 indicating a match between an input row address and an address of a row including at least one weak memory cell 412. Additionally, the write assist enable circuit 402 conditions activation of the corresponding write assist circuit 406 on matching an input column address (e.g., Col ADDR) to an identifier of at least one column in the memory block 401 that includes at least one weak memory cell 412. As such, write assist enable circuit 402 can condition activation of the write assist circuit 406 on writing to both a row and column that includes a weak memory cell 412, based on the techniques described herein.

The write assist enable circuit 402 can include logic that performs a comparison operation between one or more stored column addresses and an input column address for a write operation (e.g., a Col ADDR). The stored column addresses to which the input column address is compared may be columns of the corresponding memory block 401 that have been determined to include at least one defective memory cell 412. The comparison may be performed via one or more logic gates or comparison circuits of the corresponding write assist enable circuit 402.

The stored column addresses may be provided as part of configuration data for the write assist enable circuit 402, as described in connection with FIGS. 1-3. The configuration data for the write assist enable circuits 402 can be stored in the write assist configuration circuit 420, which may be similar to and include any of the structure and functionality of the write assist configuration circuit 220 of FIG. 2. In this example, the configuration data that is provided to (e.g., shifted through) one or more registers of the write assist enable circuits 402A-402N can include column addresses of each of any columns in the memory blocks 401A-401N that are determined (e.g., via the testing processes described herein) to include at least one weak memory cell 412. The configuration data may be provided to the write assist enable circuits 402 in response to a reset, power-on, or a configuration signal.

Additionally, the write assist enable circuits 402 can further condition activation of the write assist circuits 406 on a signal from the address match circuit 414. For example, the write assist configuration circuit 420 can provide data to a row address match circuit 414. The row address match circuit 414 can include logic gates, transistors, or any other device or circuit that can compare an input row address for a write operation and a stored row address provided by the write assist configuration circuit 420. The row address match circuit 414 can include any of the structure of, and implement any of the functionality of, the row address match circuit 314 of FIG. 3.

The row address match circuit 414 can provide an activation signal to the write assist enable circuits 402 in response to detecting a match between an input row address of the memory circuit 400 and a stored row address that is identified as including a weak memory cell 412. The write assist configuration circuit 420 can provide addresses of rows that are determined to include at least one weak memory cell 412 (e.g., the Row 1 ADDR, as shown) to the row address match circuit 414, for example, in response to a reset, a power-on, or in response to a configuration signal. The write assist configuration circuit 420 can therefore provide configuration data to both the address match circuit and the write assist enable circuit 402. When the write assist enable circuit 402 selectively activates the write assist circuit 406, the increased voltage produced by the write assist circuit 406 can be provided via the output of the multiplexor 404 that corresponds to the respective Col ADDR of the write operation. For example, as shown, if a write operation occurs on at the Row 1 ADDR and the second column of memory block 401A, the write assist enable circuit 402A activates the write assist circuit 406A, which provides corresponding outputs via the second output 416 of the multiplexor 404A.

Figure 5:
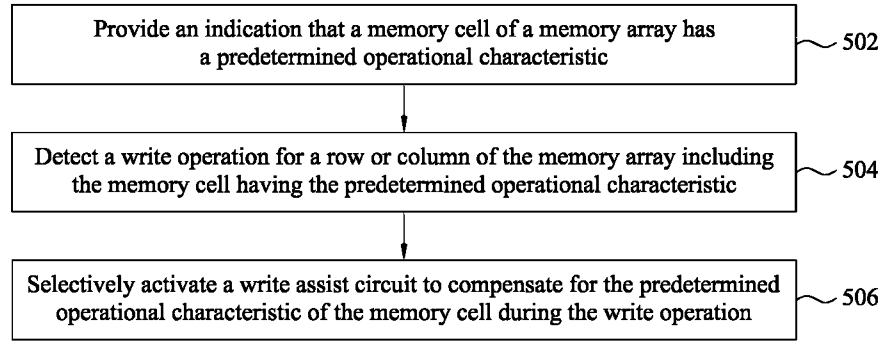
FIG. 5 illustrates a flowchart of an example method to operate the disclosed memory arrays including selectively activated write assist circuits described herein, in accordance with some embodiments of the present disclosure.

FIG. 5 illustrates a flowchart of an example method 500 to operate the disclosed memory circuits 100, 200, 300, and 400 of FIGS. 1-4, respectively, in accordance with some embodiments of the present disclosure. The method 500 may be used to operate a memory circuit or device (e.g., the memory circuit 100, the memory circuit 200, the memory circuit 300, the memory circuit 400, etc.) to selectively active write assist circuits. For example, at least some of the operations described in the method 500 use layouts and schematics described in FIGS. 1-4. It is noted that the method 500 is merely an example and is not intended to limit the present disclosure. Accordingly, it is understood that additional operations may be provided before, during, and after the method 500 of FIG. 5, and that some other operations may only be briefly described herein.

In brief overview, the method 500 starts with operation 502 of providing an indication (e.g., via the WA Shift signal) that a memory cell (e.g., the weak memory cell 112) of a memory array has a predetermined operational characteristic (e.g., being a weak memory cell, as opposed to a normally operating memory cell). The method 500 proceeds with operation 504 of detecting a write operation (e.g., via the "Write" signal) for a row or column (e.g., identified by a Row ADDR or Col ADDR, as described herein) of the memory array including the memory cell having the predetermined operational characteristic. The method 500 concludes with operation 506 of selectively activating a write assist circuit to compensate for the predetermined operational characteristic of the memory cell during the write operation.

Referring to operation 502, an indication (e.g., via the WA Shift signal) that a memory cell (e.g., the weak memory cell 112) of a memory array has a predetermined operational characteristic (e.g., being a weak memory cell, as opposed to a normally operating memory cell) is provided. The indication may be generated by one or more test circuits, which may be included in one or more write assist configuration circuits (e.g., the write assist configuration circuits 120, 220, 320, or 420, etc.). The indication may include a row and/or column address for any memory cells identified as a weak memory cell. The indication may include indications of each memory block of the memory array that includes at least one weak memory cell. The indications may be stored in one or more storage devices, such as programmable memory (e.g., flash memory, eFuse memory, etc.). Weak memory cells may be identified using a testing circuit, such as a BIST or BISTR circuit, or an external testing circuit.

Referring to operation 504, a write operation (e.g., via the "Write" signal) for a row or column (e.g., identified by a Row ADDR or Col ADDR, as described herein) of the memory array including the memory cell having the predetermined operational characteristic is detected. The write operation may be detected as corresponding to the memory block, column, and/or row that includes at least one weak memory cell. For example, a row address match circuit (e.g., the row address match circuit 314, the row address match circuit 414) can detect a write operation to a row that includes at least one weak memory cell. A write assist enable circuit can detect a write operation to a memory block and/or a column including at least one weak memory cell.

Referring operation 506, a write assist circuit (e.g., the write assist circuit 106, the write assist circuit 206, the write assist circuit 306, and the write assist circuit 406, etc.) is selectively activated to compensate for the predetermined operational characteristic of the memory cell during the write operation. For example, activation of a write assist circuit for a memory block may be conditioned on detection of a write operation to the memory block, a row, and/or column including at least one weak memory cell. The write assist circuit can produce an increased voltage across the weak memory cell during the write operation to compensate for its operational characteristics (e.g., manufacturing defects that affect its ability to retain its state during write operations).

In one aspect of the present disclosure, a semiconductor device is disclosed. The semiconductor device includes a memory array comprising a first memory cell and a second memory cell, the second memory cell having an operational characteristic different than that of the first memory cell. The semiconductor device includes a first write circuit configured to write first data to the first memory cell. The semiconductor device includes a second write circuit configured to write second data to the second memory cell. The second write circuit is selectively configured to compensate for the operational characteristic of the second memory cell.

In another aspect of the present disclosure, a memory circuit is disclosed. The memory circuit includes a write driver device configured to write input data to one of a first column or a second column of a memory array. The memory circuit includes a write assist circuit configured to cause the write driver device to selectively operate at one of a first voltage or a second voltage. The memory circuit includes a write assist enable circuit configured to activate the write assist circuit based on an indication that the first column or the second column comprises a memory cell having a defect.

Yet another aspect of the present disclosure is directed to a method. The method includes providing an indication that a memory cell of a memory array has a predetermined operational characteristic. The method includes detecting a write operation for a row or column of the memory array including the memory cell having the predetermined operational characteristic. The method includes selectively activating a write assist circuit to compensate for the predetermined operational characteristic of the memory cell during the write operation.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a memory array comprising a first memory cell and a second memory cell, the second memory cell having an operational characteristic different than that of the first memory cell;

a first write driver circuit configured to write first data to the first memory cell, the first write driver circuit coupled with a first write assist enable circuit;

a second write driver circuit configured to write second data to the second memory cell, wherein the second write driver circuit is coupled to a second write assist enable circuit; and a write assist configuration circuit configured to shift configuration data through a shift register of the first write assist enable circuit and the second write assist enable circuit to designate the second write driver circuit for activation, causing the second write assist enable circuit to configure the second write driver circuit to compensate for the operational characteristic of the second memory cell.

2. The semiconductor device of claim 1, wherein the first memory cell and the second memory cell each comprise a respective bit cell in the memory array.

3. The semiconductor device of claim 1, wherein the first write driver circuit is configured to operate at a first voltage to write the first data to the first memory cell and the second write driver circuit is configured to operate at a second voltage to write the second data to the second memory cell.

4. The semiconductor device of claim 3, further comprising a register storing control data that indicates the first write driver circuit is to operate at the first voltage and the second write driver circuit is to operate at the second voltage.

5. The semiconductor device of claim 1, wherein the first write assist enable circuit comprises a latch configured to receive a value from a shift register of the first write assist enable circuit and cause the second write driver circuit to operate using a second voltage.

6. The semiconductor device of claim 5, wherein the latch causes the second write driver circuit to operate using the second voltage based on a column address of the second memory cell.

7. The semiconductor device of claim 1, further comprising:

an address match circuit configured to produce a write assist enable signal upon receiving a write address corresponding to the second memory cell, wherein the second write driver circuit is configured to compensate for the operational characteristic of the second memory cell based on the write assist enable signal.

8. The semiconductor device of claim 1, further comprising a multiplexer circuit configured to receive a write signal from the second write driver circuit and provide the write signal to one of a first column or a second column, the first column comprising the second memory cell.

9. The semiconductor device of claim 1, wherein the first write driver circuit is coupled to a first column comprising the first memory cell and the second write driver circuit is coupled to a second column comprising the second memory cell.

10. A memory circuit, comprising:

a write driver device configured to write input data to one of a first column or a second column of a memory array;

a write assist circuit configured to cause the write driver device to selectively operate at one of a first voltage or a second voltage;

a write assist enable circuit comprising a shift register and configured to activate the write assist circuit based on an indication that the first column or the second column comprises a memory cell having a defect; and a write assist configuration circuit configured to shift configuration data through the shift register of the write assist enable circuit, causing the write assist enable circuit to designate the first column or the second column as having the defect.

11. The memory circuit of claim 10, further comprising:

a multiplexer device configured to receive a write signal from the write driver device and provide the write signal to one of the first column or the second column of the memory array, the first column or the second column selected based on a column address signal.

12. The memory circuit of claim 11, wherein the write assist enable circuit is configured to activate the write assist circuit further based on the column address signal matching a column address of the memory cell having the defect.

13. The memory circuit of claim 10, wherein the memory cell having the defect is defined within a first row of the memory array, the memory circuit further comprising:

a row address match circuit configured to generate a row enable signal upon detecting a match between an input row address and an address of the first row, write assist enable circuit configured to activate the write assist circuit further based on the row enable signal.

14. The memory circuit of claim 13, further comprising:

a multiplexer device configured to receive a write signal from the write driver device and provide the write signal to one of the first column or the second column of the memory array, the first column or the second column selected based on a column address signal.

15. The memory circuit of claim 14, wherein the write assist enable circuit is configured to activate the write assist circuit further based on the column address signal matching a column address of the memory cell having the defect.

16. The memory circuit of claim 10, wherein the write assist circuit is further configured to cause the write driver device to produce a boosted write voltage for writing to the memory cell having the defect.

17. The memory circuit of claim 10, wherein the write assist circuit is further configured to cause the write driver device to reduce a ground voltage for writing to the memory cell having the defect.

18. A method, comprising:

shifting, by a write assist configuration circuit, configuration data through a shift register of a first write assist enable circuit and a second write assist enable circuit, the configuration data comprising an indication that a memory cell of a memory array has a predetermined operational characteristic;

detecting, by the first write assist enable circuit, a write operation for a row or column of the memory array including the memory cell having the predetermined operational characteristic; and selectively activating, by the first write assist enable circuit, a write assist circuit to compensate for the predetermined operational characteristic of the memory cell during the write operation based on the indication.

19. The method of claim 18, wherein detecting the write operation comprises comparing an input column address for the write operation to a column address of the memory cell having the predetermined operational characteristic.

20. The method of claim 18, wherein detecting the write operation comprises comparing an input row address for the write operation to a row address of the memory cell having the predetermined operational characteristic.

* * * * *